June 9, 1959 A. J. W. M. VAN OVERBEEK 2,890,293

TRANSISTOR AMPLIFIER HAVING SIMULTANEOUS GAIN AND SELECTIVITY CONTROL

Filed April 4, 1955

PRIOR ART

INVENTOR
ADRIANUS JOHANNES WILHELMUS
MARIE VAN OVERBEEK
BY Fred M. Vogel
AGENT

United States Patent Office 2,890,293

Patented June 9, 1959

2,890,293

TRANSISTOR AMPLIFIER HAVING SIMULTANEOUS GAIN AND SELECTIVITY CONTROL

Adrianus Johannes Wilhelmus Marie van Overbeek, Eindhoven, Netherlands, assignor, by mesne assignments, to North American Philips Company, Inc., New York, N.Y., a corporation of Delaware Application April 4, 1955, Serial No. 499,125

7 Claims. (Cl. 179—171)

The present invention relates to an amplifier circuit arrangement with gain control. More particularly, the invention relates to an amplifier comprising a transistor with gain control by means of a control-current, and a resonance circuit coupled with the transistor input electrodes. It is found with such an amplifier that the internal input impedance of the transistor varies with the control-current, which, as is shown, results not only in a variation of the tuning but also of the damping of the resonance circuit, which may adversely affect the selectivity of the amplifier.

In accordance with the invention this resonance circuit together with the transistor constitutes a closed series circuit comprising an inductor, a capacitor and the input impedance of the transistor. Connected in parallel with said input impedance is an impedance having a value which lies between the minimum value and the maximum value of said input impedance; said input impedance being varied by the control-current. This method of connection may ensure that the selectivity of the amplifier varies to a desired extent with the control current while detuning of the circuit is mitigated and becomes substantially negligible, if the transistor is operated in grounded base connection and if the external impedance has mainly the nature of a resistor. The term "grounded base connection" is to be understood to mean, as usual that the base circuit is in common to the input circuit and the output circuit of the transistor.

The invention will now be described with reference to the drawing, wherein.

Figure 1:
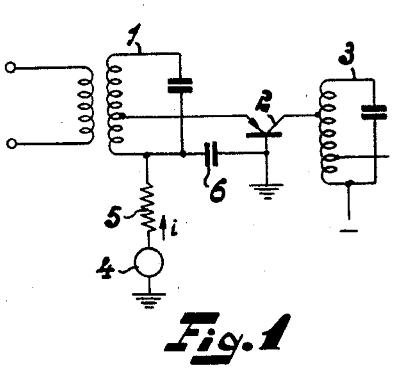
Fig. 1 is a schematic diagram of an amplifier circuit arrangement known in the art.

Fig. 1 shows a transistor amplifier for the high-frequency or intermediate-frequency section of a radio receiver, comprising a resonance circuit 1, through which the oscillations to be amplified are supplied to a transistor 2, having an output circuit 3, across which the amplified oscillations are produced. For the automatic or non-automatic control of the amplification a source 4, obtained in the case of automatic control particularly by rectification of the output oscillation, supplies a control-current *i* through a resistor 5 to the transistor input circuit. The separation capacitor 6 constitutes a short-circuit for the oscillations to be amplified.

This circuit arrangement has a limitation in that, due to the control-current *i* the input impedance of the transistor 2 and hence at least the damping of the circuit 1 are varied, i.e. in a sense such that at a decrease in the control-current *i* the transistor input impedance and hence the selectivity of the amplifier increase, whereas the amplification decreases. This effect is unwanted, since, more particularly with radio reception, for the amplification of a weak input signal use is preferably made of an amplifier having high selectivity in order to reduce the possibility of interference, whereas, if a stronger input signal is received, and if the amplification is thus adjusted to a lower value, the selectivity of the amplifier must certainly not increase.

Figure 2:
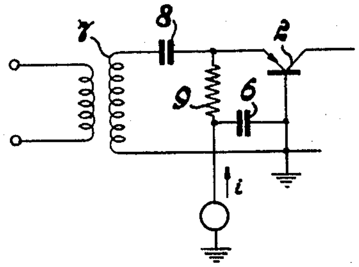
Fig. 2 is a schematic diagram of an embodiment of the circuit arrangement of the present invention.

In order to ensure in the last-mentioned case that the selectivity of the amplifier decreases, the resonance circuit of Fig. 1 in the embodiment shown in Fig. 2 is connected in a manner such that together with the transistor 2 it constitutes a closed series circuit comprising an inductor 7, a capacitor 8 and the transistor input impedance. At a decrease in control-current *i* the transistor input impedance increases, so that the amplification decreases, but since the last-mentioned impedance is connected in series with the inductor 7 and the capacitor 8, the selectivity of the amplifier decreases accordingly.

This impedance variation is found, however, in practice to be so high that it would be attended by an undesirably large selectivity variation. This variation is, however, reduced by connecting in parallel with the transistor input impedance, an impedance 9, 6 having a value which lies between the minimum value and the maximum value of the transistor input impedance; said input impedance being varied by the control-current *i*.

The aforesaid principle may be applied not only to a transistor in grounded base connection, as is shown, but also to a transistor in grounded emitter connection. In this case, however, it is more troublesome that the variation of the transistor input impedance is also attended by detuning of the circuit. This detuning remains slight in the arrangement shown in Fig. 2, if the impedance 9, 6 has mainly the nature of a resistor and for example comprises a resistor 9 and a separation capacitor 6, described with reference to Fig. 1.

In a practical embodiment the circuit elements had the following values: inductor 7=1.5 millihenries, capacitor 8=85 micromicrofarads, resistor 9=100 ohms, capacitor 6=20,000 micromicrofarads. At a variation of the control-current *i* from 1.2 to 0.12 milliamperes, the input impedance of the transistor varied from 25 to 250 ohms, the bandwidth from 6.5 to 12 kilocycles per second and the amplification from 22 to 8 decibels.

Figure 3:
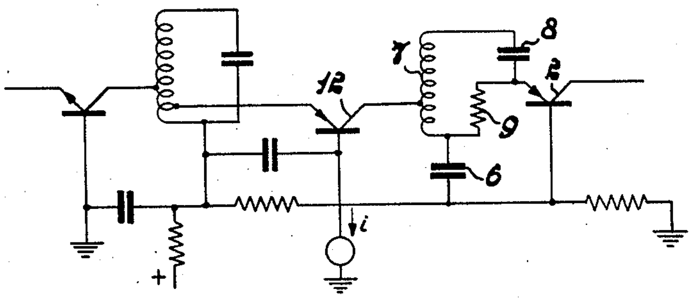
Fig. 3 is a modification of the embodiment of Fig. 2.

On the other hand the impedance 9, 6 introduces a slight loss in amplification; the greater the loss, the smaller the value of the impedance. In Fig. 3 the impedance 9, 6 in parallel with the input circuit of the transistor 2 is chosen to be so high in value in the range between the minimum and maximum values of the transistor input impedance that it introduces only a small loss in amplification. The selectivity variation of the transistor amplifier 2, 7, 8 is, however, as a function of a control-current *i* amplified in a preceding transistor 12, larger than is desirable. For the amplifier combination 12, 2 this selectivity variation, is however, reduced, since the transistor 12 is connected similarly to that shown in Fig. 1, so that it exhibits a selectivity variation opposite to that of the amplifier 2, 7, 8.

What is claimed is:

1. An amplifier circuit arrangement comprising a transistor having input electrodes, output electrodes and an internal input impedance between said input electrodes, said input impedance undergoing variations in value as determined by variations of a control current applied to said input electrodes, a series resonant circuit comprising an inductor and a capacitor in series circuit arrangement with said input electrodes, an impedance branch connected in parallel with said input impedance, said impedance branch having an impedance value which is between the minimum value and the maximum value of said input impedance, means for controlling the gain of said amplifier circuit arrangement comprising means for applying a control current to said input electrodes thereby to vary said input impedance, means for applying an input signal to said series resonant circuit, and means for deriving an output signal from said output electrodes.

2. An amplifier circuit arrangement comprising a transistor having input electrodes, output electrodes and an internal input impedance between said input electrodes, said input impedance undergoing variations in value as determined by variations of a control current applied to said input electrodes, a series resonant circuit comprising an inductor and a capacitor in series circuit arrangement with said input electrodes, a resistive impedance connected in parallel with said input impedance, said resistive impedance having an impedance value which is between the minimum value and the maximum value of said input impedance, means for controlling the gain of said amplifier circuit arrangement comprising means for applying a control current to said input electrodes thereby to vary said input impedance, means for applying an input signal to said series resonant circuit, and means for deriving an output signal from said output electrodes.

3. An amplifier circuit arrangement comprising a transistor having an emitter electrode, a collector electrode, a base electrode and an internal input impedance between said emitter electrode and said base electrode, said input impedance undergoing variations in value as determined by variations of a control current applied to said emitter and base electrodes, a series resonant circuit comprising an inductor and a capacitor connected in series circuit arrangement between said emitter electrode and said base electrode, an impedance branch connected in parallel with said input impedance, said impedance branch having an impedance value which is between the minimum value and the maximum value of said input impedance, means for controlling the gain of said amplifier circuit arrangement comprising means for applying a control current to said emitter and base electrodes thereby to vary said input impedance, means for applying an input signal to said series resonant circuit, and means for deriving an output signal from said collector electrode and said base electrode.

4. An amplifier circuit arrangement comprising a first transistor having input electrodes, output electrodes and an internal input impedance between said input electrodes, said input impedance undergoing variations in value as determined by variations of a control current applied to said input electrodes, a series resonant circuit comprising an inductor and a capacitor in series circuit arrangement with said input electrodes, an impedance branch connected in parallel with said input impedance, said impedance branch having an impedance value which is between the minimum value and the maximum value of said input impedance, a second transistor having an emitter electrode, a collector electrode and a base electrode, said collector electrode being coupled to said series circuit arrangement, means for controlling the gain of said amplifier circuit arrangement comprising means for applying a control current to said base electrode thereby to vary said input impedance, means for applying an input signal to said emitter electrode, and means for deriving an output signal from said output electrodes.

5. An amplifier circuit arrangement comprising a transistor having an emitter electrode, a collector electrode, a base electrode and an internal input impedance between said emitter electrode and said base electrode, said input impedance undergoing variations in value as determined by variations of a control current applied to said emitter and base electrodes, said base electrode being connected to a point at ground potential, a series resonant circuit comprising an inductor and a capacitor connected in series circuit arrangement between said emitter and base electrodes, a resistive impedance conneceted in parallel with said input impedance, said resistive impedance having an impedance value which is between the minimum value and the maximum value of said input impedance, means for controlling the gain of said amplifier circuit arrangement comprising means for applying a control current to said emitter and base electrodes thereby to vary said input impedance, means for applying an input signal to said series resonant circuit, and means for deriving an output signal from said collector and base electrodes.

6. An amplifier circuit arrangement comprising first and second transistors each having input electrodes, output electrodes and an internal input impedance between said input electrodes, each said input impedance undergoing variations in value as determined by variations of a control current applied to said input electrodes, a series resonant circuit comprising an inductor and a capacitor in series circuit arrangement with the input electrodes of said first transistor, an impedance branch connected in parallel with the input impedance of said first transistor, said impedance branch having an impedance value which is between the minimum value and the maximum value of the input impedance of said first transistor, means for coupling the output electrodes of said second transistor to said series circuit arrangement, means for applying an input signal to the input electrodes of said second transistor, means for deriving an output signal from the output electrodes of said first transistor, and means for controlling the gain of said amplifier circuit arrangement comprising means for applying a control current to the input electrodes of said second transistor, said second transistor being connected to exhibit a signal selectivity variation opposite that of said first transistor.

7. An amplifier circuit arrangement as claimed in claim 6, wherein said control current is amplified in magnitude by said second transistor.

References Cited in the file of this patent

UNITED STATES PATENTS

| | | |
|---|---|---|
| 2,556,286 | Meacham | June 12, 1951 |
| 2,652,460 | Wallace | Sept. 15, 1953 |
| 2,691,074 | Eberhard | Oct. 5, 1954 |
| 2,704,792 | Eberhard et al. | Mar. 22, 1955 |

UNITED STATES PATENT OFFICE

CERTIFICATE OF CORRECTION

June 9, 1959

Patent No. 2,890,293

Adrianus Johannes Wilhelmus Marie van Overbeek

It is hereby certified that error appears in the above numbered patent requiring correction and that the said Letters Patent should read as corrected below.

In the heading to the printed specification, between lines 8 and 9 thereof, insert -- Claims priority, application Netherlands May 11, 1954 --.

Signed and sealed this 22nd day of December 1959.

(SEAL)
Attest:

KARL H. AXLINE
Attesting Officer

ROBERT C. WATSON
Commissioner of Patents